United States Patent [19]

Maruska et al.

[11] Patent Number: 4,739,383
[45] Date of Patent: Apr. 19, 1988

[54] OPTICAL DETECTOR AND AMPLIFIER BASED ON TANDEM SEMICONDUCTOR DEVICES

[75] Inventors: Paul H. Maruska, Annandale; Michael C. Hicks, Flemington; Theodore D. Moustakas, Annandale, all of N.J.

[73] Assignee: Exxon Research and Engineering Company, Florham Park, N.J.

[21] Appl. No.: 916,871

[22] Filed: Oct. 9, 1986

Related U.S. Application Data

[63] Continuation of Ser. No. 712,099, Mar. 15, 1985, abandoned.

[51] Int. Cl.$^4$ .................... H01L 27/14; H01L 31/00
[52] U.S. Cl. ......................................... 357/30; 357/2; 357/15; 250/211 J; 250/211 R
[58] Field of Search .................... 357/30, 15, 2, 16; 250/211 J, 211 R, 213 R

[56] References Cited

U.S. PATENT DOCUMENTS 4,297,720 10/1981 Nishizawa et al. ............ 357/30
4,387,265 6/1983 Dalal ................................. 357/30

OTHER PUBLICATIONS

Woodall et al., IBM Disclosure Bulletin, "Differential Phototransistor", Feb. 1970, vol. 12, No. 9, p. 1486.

Primary Examiner—William L. Sikes
Assistant Examiner—Georgia Y. Epps
Attorney, Agent, or Firm—Ronald D. Hantman

[57] ABSTRACT

If a semiconductor device is prepared so that it contains a photoconductive region in electrical series with a photovoltaic region, (i.e., a Schottky barrier or p-n junction) it can function as an optical amplifier and detector. When weak ac light plus an intense dc light are focused on this sample in an appropriate manner, the detected ac electric current will correspond to the intensity of the dc light but have the phase of the ac light; thus a weak ac light signal is effectively amplified, or a dc light signal is converted into an ac electrical signal capable of synchronous detection.

11 Claims, 2 Drawing Sheets

OPTICAL DETECTOR AND AMPLIFIER BASED ON TANDEM SEMICONDUCTOR DEVICES

This is a continuation of application Ser. No. 712,099, filed 3-15-85, now abandoned.

BACKGROUND OF THE INVENTION

The present invention relates to semiconductor devices. In particular, the present invention relates to optical detectors and optical amplifiers.

There are presently available two classes of devices for generating an electrical signal in response to an applied optical excitation, viz., photoconductors and photodiodes. A photoconductor is a device which undergoes a substantial decrease in resistance upon the absorption of light; it requires that an external voltage be applied during operation, and is capable of gains (ratio of electrons passed to photons absorbed) greater than unity. A photodiode contains a potential barrier and generates a voltage upon illumination, so that it is self-powered, but exhibits no gain. Such devices have been described by Richard H. Bube, "Photoconductivity of Solids", John Wiley & Sons, (1967).

In order to synchronously detect a signal due to a dc light source incident on either of these devices, the light is typically "chopped" by a slotted rotating wheel driven by a motor. Such a chopper therefore can convert a continuous magnitude (dc) light signal into a pulsed (ac) signal, which will generate an ac electrical current in a photo-responsive semiconductor device. Such an ac current can be phaselocked with a synchronous detector such as a lock-in amplifier, to avoid the detection of spurious, extraneous signals. However, such choppers tend to be large and clumsy, the motors consume power, they are expensive, and they may generate unwanted noise.

In addition, it is often desired to amplify the magnitude of a detected signal that was created by an ac light originating from an external source and which contains information. In some cases it would be convenient to do this without relying on an external power supply for amplification, such as in a remote location.

The present invention combines in tandem a photodiode and a photoconductive region. The new device is self-powered and can exhibit gains >1, has no rotating mechanical parts, and relies entirely upon optical effects. No external voltage supply is required.

SUMMARY OF THE INVENTION

The present invention is a tandem semiconductor device which includes a material having a photovoltaic junction in electrical series with a material that is known to be photoconductive. The two materials may be formed from the same or from different semiconductors. The two regions may be formed sequentially so as to lie in optical series, or they may be located separately and connected with an electrically conductive medium. In any case, the contacts to the photoconductor must be ohmic, which means that no charge depletion region is allowed at the interface between the photovoltaic and photoconductive sections. Such an arrangement requires a suitable choice of fermi levels (electrochemical potentials) and/or work functions so as to avoid the formation of extraneous potential barriers. The only allowed potential barrier will be located at the photovoltaic junction in the photovoltaic region.

BRIEF DESCRIPTION OF THE DRAWINGS

FIG. 1 is a schematic diagram showing three possible embodiments of the present invention.

DESCRIPTION OF THE PREFERRED EMBODIMENT

As described above, the present invention combines in tandem a photodiode and a photoconductive region. The new device is self-powered and can exhibit gains >1, has no rotating mechanical parts, and relies entirely upon optical effects. No external voltage is required.

It can function either as an optical detector or an amplifier. In either mode, a dc light is absorbed in the photodiode, while an ac light is absorbed in the photoconductor. If detection of the dc light is required, then the ac light serves to gate the signal from the dc light through the photoconductor to allow synchronous detection by a frequency sensitive ac voltmeter. If amplification of a weak ac optical signal is desired, the magnitude of the controlled dc light can be increased to allow the synchronous voltmeter to measure apparent gains exceeding unity (ratio of electrons detected to ac photons absorbed).

The new device described above therefore requires the presence of two optical signals, one dc and one ac, to generate an electrical signal. The magnitude of the electrical signal is determined by the intensity of the dc light, while the phase of the electrical signal is determined by the phase of the ac light.

The ac light source may be a light-emitting diode (LED) operated by a microprocessor chip. The dc light may be an incandescent or arc lamp, or sunlight.

Figure 1A:
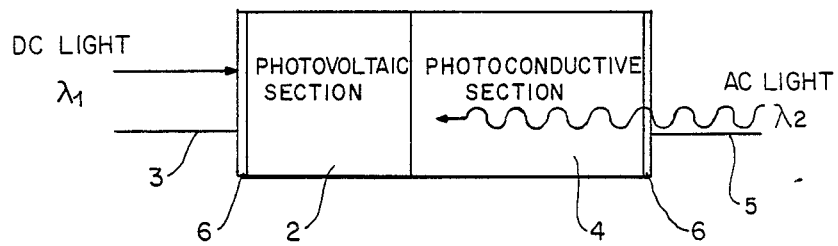
FIG. 1a shows the photovoltaic section in tandem with the photoconductor section illuminated from opposite sides.
Figure 1B:
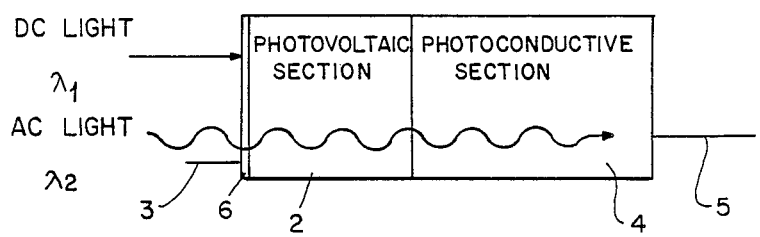
FIG. 1b shows the photovoltaic section in tandem with the photoconductor section illuminated from the same side.
Figure 1C:
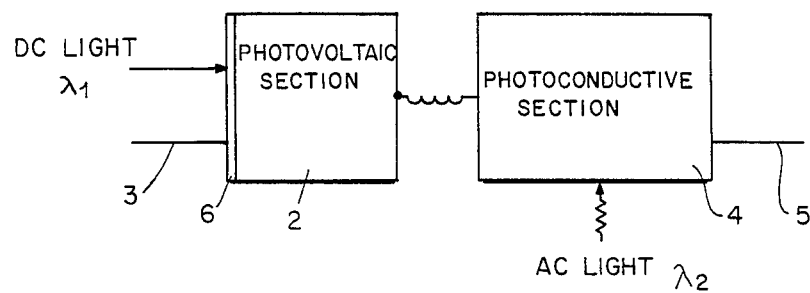
FIG. 1c shows the photovoltaic section physically separated from the photoconductive section but connected by a wire and illuminated independently.

The present invention is shown schematically in FIG. 1 as three possible embodiments.

The device in all cases includes a region having a photovoltaic junction (photodiode) 2 and a region composed of photoconductive material 4. In addition, the device needs electrical contacts 3, 5 to carry electrical charge into and out of the device. Therefore, a transparent conductor or conductive grid arrangement 6 may be necessary to allow light to pass into the photodiode and photoconductive material. In the first embodiment (FIG. 1-a) the device includes a photoconductive material in tandem with the photovoltaic region (hereinafter called photodiode). The optical absorption constant, $\alpha_1$, of the photodiode cell and its thickness $l_1$, and the optical absorption constant, $\alpha_2$ of the photoconductor and it thickness $l_2$ determine the wavelengths at which the device may be operated. The dc light will have wavelength $\lambda_1$ while the ac light will have wavelength $\lambda_2$.

The optical absorption constant, $\alpha$, is determined according to the function, $\exp(-\alpha x)$, which gives the fraction of incident photons on a material per cm$^2$ per sec that are still present after the incident beam penetrates a distance x into a medium. The absorption constant, $\alpha$, depends on the wavelength, $\lambda$, of the incident radiation.

There is a critical wavelength $\lambda_c$ for which when $\lambda_1 < \lambda_c, \alpha_1(\lambda_1) \times l_1 > 1$. When this conditions holds, the dc light focussed on the device essentially will not penetrate through the photovoltaic cell into the photoconductor (i.e., the light travelling past the distance $l_1$ will be less than 1/e or 0.36 of the incident light). The unilluminated photoconductor is fabricated so as to possess a very large dark resistance, and it will not pass the current generated in the photovoltaic cell. However, if a pulsed (hence ac) light is also applied to the rear of the device, and its wavelength $\lambda_2$ is adjusted so that $\alpha_2(\lambda_2) \times l_2 > 1$, then the ac light will be absorbed throughout the photoconductor. Thus while a pulse of this second light is on, the dark resistance of the photoconductor is eliminated and the current from the photodiode section, due entirely to the dc light which is being strongly absorbed in the photodiode, can pass. However, it can only pass while the second light is on. Thus, the electrical signal originally generated in the photodiode and now switched through the gated photoconductor, will be an ac signal that can be measured by an ac voltmeter. ac signals can be easily amplified while dc signals in general are much more difficult to handle in amplifiers. If the device is used as described above, it functions as an optical detector for the dc light.

In an alternate embodiment (FIG. 1b), ac light can be incident on the device from the same side as the incident dc light, directly on the photodiode. A third criterion, $\alpha_1(\lambda_2) \times l_1 < 1$ is necessary to insure that the pulsed light does pass through the photodiode, to be absorbed in the photoconductor.

In the third embodiment (FIG. 1c), the two sections may occupy physically separate locations as long as they are connected by a wire that makes ohmic contact to both units. The suitable wavelengths of light are the same as in the first embodiment.

The possible materials that may be used in the present invention include: amorphous silicon, amorphous silicon-germanium, silicon-carbide and silicon-nitride alloys; cadmium sulfide, copper sulfide, cadmium telluride, copper indium selenide, mercury cadmium telluride, lead sulfide, lead selenide, lead telluride; crystalline silicon; gallium arsenide; aluminum gallium arsenide; indium arsenide; indium phosphide. It should be noted that the absorption spectra of the amorphous materials essentially span the wavelength region from the near IR to the UV. Also, mercury cadmium telluride and the lead compounds are infrared absorbers so they could be used in a system to detect escaped hydrocarbons in a refinery. The materials are chosen to suit the wavelengths that are supposed to be detected, or amplified.

The photovoltaic junction region and the photoconductive region may be different materials or they may include a common material. For example, the photovoltaic junction may be comprised of $Cu_2S$ and $CdS$ while the photoconductive region is $CdS$. Or else, the photovoltaic section might be crystalline silicon (an excellent photovoltaic current generator) connected electrically (with a wire as in FIG. 1c) to cadmium sulfide (a well-known photoconductor).

The photovoltaic junction may be a Schottky barrier which includes a metal and a semiconductor. The photoconductive region may then include the same semiconductor material.

The present invention may also be used as an optical amplifier. Suppose one is interested in detecting ac light whose intensity is very weak. A strong dc light incident on the tandem device will allow the measurement of a much larger magnitude of electrical current than the ac light itself could have generated. As reference to FIG. 2 will indicate, a signal whose magnitude is determined by the dc light but whose phase is determined by the ac light will emerge from the device.

This operation is analogous to a traditional triode amplifier (i.e., a vacuum tube or transistor) which works as follows: a large dc voltage is applied between the anode and the cathode, but no information is present because the magnitude is constant. When a small ac signal is inserted between the anode and cathode, the cathode current is caused to vary in phase with this ac signal, but with a much larger magnitude than the ac signal possessed. However, in the present invention, no external bias is needed for our device since it provides its own driving voltage (at the photovoltaic junction); that is, it does not need a power supply.

Thus, the present invention is capable of detecting and amplifying weak sources of ac light. The ac light may be incident on the device in any of the manners shown in FIG. 1.

EXAMPLE—Optically Controlled Amorphous Silicon Photosensitive Device

In amorphous silicon m-i-n and p-i-n photovoltaic cells, essentially all of the photogenerated current is provided by the nominally undoped intrinsic "i" layer, see e.g., R. Williams and R. S. Crandall, "Carrier generation, recombination and transport in amorphous silicon solar cells," *RCA Rev.*, vol. 40, pp. 371–389, 1979. Thus, the properties of this i-layer are crucial to device performance. Ideally, in such a photovoltaic cell, the i-layer should be fully depleted of mobile charge, so that a strong electric field will exist throughout the region. This field is required to collect the photocurrent, because the diffusion length in amorphous silicon tends to be small (<1 $\mu$m).

In preparing a tandem device, one would deposit an i-layer of sufficient thickness that a portion thereof would not be depleted of charge, and therefore a neutral (field free) region of the i-layer will exist. This field-free region of the i-layer will function as a series resistance because of its low dark conductivity. However, it is known that intrinsic amorphous silicon (i.e., the i-layer) is a good photoconductor, see e.g., C. R. Wronski, "Electronic properties of amorphous silicon in solar cell operation", *IEEE Trans, Electron Devices*, vol. ED-24, pp. 351–357, 1977. The photoconductivity of the field-free region of the i-layer can be utilized to eliminate the series resistance effects. The field-free, non-depleted region of the i-layer will serve as the photoconductor, in series with the photovoltaic region.

The phenomenon of interest for the new device is encountered in amorphous silicon samples that have a highly resistive (field-free) region of the i-layer situated in series with the region of current generation. The discussion will focus on a particular device, an m-i-n (Schottky barrier) structure with a 0.4 $\mu$m-thick i-layer which had been deposited on a transparent conducting glass substrate. The field-free region of the i-layer (i.e., the photoconductor) was 0.3 μm thick.

The experiment involved a continuously tunable source of pulsed (ac) monochromatic light, and a continuous intensity dc light. The intensity of the dc beam could be controlled when desired. The ac light beam was adjusted to give an average flux of $10^{13}$–$10^{14}$ photons/s-cm$^2$. The chopper ac light beam and the dc light beam were focussed simultaneously on the front of the sample (i.e., on the semi-transparent metal contact). The detected signals were measured with a lock-in amplifier (Princeton Applied Research Model 124-A).

Figure 2:
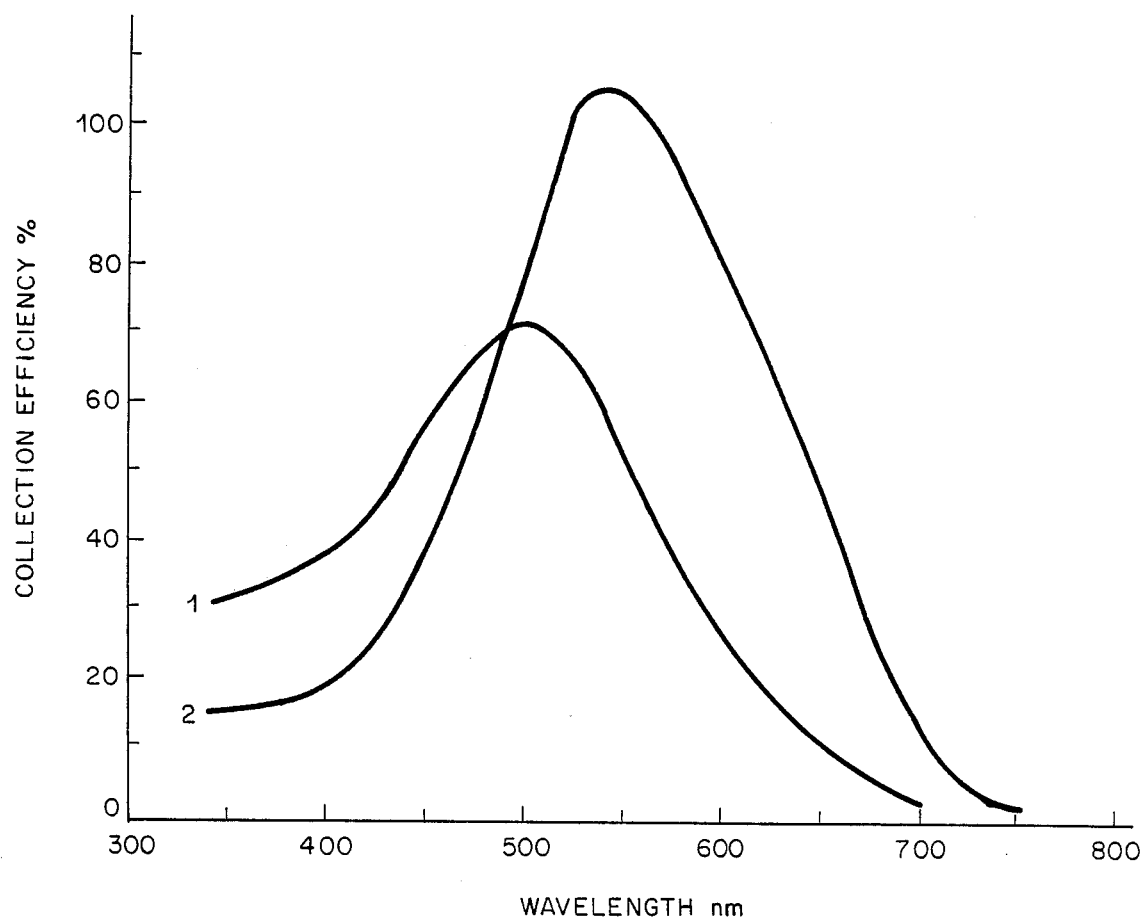
FIG. 2 shows the spectral response to an applied ac light of variable wavelength of an entirely amorphous silicon optical amplifier and detector, having a p-i junction photovoltaic cell at the front, followed by an intrinsic (i) amorphous silicon photoconductor at the rear. The wavelengths of the monochromatic dc lights are as follows: (1) no dc light, (2) dc light front with $\alpha_1(\lambda_{c1})l_1 > 1$.

The experimental data is collected in FIG. 2. Curve #1 shows the collection efficiency that was obtained as a function of the wavelength of the incident ac light when only the chopped (ac) light was on, and the dc light was off. Signal was detected by the lock-in amplifier only in response to ac light of wavelengths 400<λ<600 nm. There was little response at the blue end of the spectrum, 300<λ<400 nm. Such blue light will only penetrate the photovoltaic member of the tandem device, leaving the photoconductor in the high resistance state.

Next, we used the dc light source that was incident on the front of the sample and set it to transmit blue light. The result that was obtained is shown in Curve #2. With this blue dc light present, the blue ac response dropped below the level found with no dc light present (Curve #1), and in addition a much stronger response developed in the region of 550 nm ac light. The extent of the response to ac light around 550±100 nm depended on the intensity of the blue dc light. As shown in the figure, we were easily able to obtain ac collection efficiencies (electrons per photon) which exceeded 100 percent at this red wavelength.

Our results can be explained as follows. As noted above, the field-free portion at the rear of the i-layer provides a series resistance which can affect the spectral response measurement by limiting the current flow. With no external dc light present and using ac blue light which penetrates only a short distance in from the front of the sample, the measured ac photocurrent is restricted by the series resistance. If, however, ac red light is used, it penetrates throughout the sample and alleviates the series resistance. Thus ac red light is self-correcting, and only the ac blue response is affected by the resistance.

However, when a blue dc light is used on the front of the sample, it only penetrates a short distance into the sample, and so the series resistance at the rear of the sample remains. The dc current generated in the photovoltaic cell by the dc blue light is restricted by the series resistance in the bulk and cannot reach the lock-in amplifier. In fact, the total current due to ac blue light and dc blue light is lower than either one because the dc potential drop across the series resistance of the dark photoconductor forward biases the cell, decreasing the internal electric field. When the ac chopped light is red, this ac red light passes throughout the sample, and the series resistance of the photoconductor becomes modulated exactly in phase with the ac signal. Thus the total current due to both light sources will show a variable magnitude in phase with the ac red light, and thus will be detected by the lock-in amplifier. This is why the magnitude of the response due to red ac light (i.e., at 550 nm) depends on the intensity of the blue dc light. Thus the apparent observation of quantum efficiencies exceeding 100 percent (shown in FIG. 2) is an artifact that results from not counting the photons in the dc blue light, although they are now capable of generating an ac signal.

It can be seen that this system functions as an optically controlled amplifier. A small ac red light beam and a large non-varying blue light beam are focussed on the properly prepared tandem amorphous silicon device, and the photocurrent is measured by a suitable ac voltmeter. The ac photocurrent will be found to be substantially larger than could have been generated solely by the photon flux of the ac red light but the phase of the signal remains unaltered, and thus amplification of the information carried by the red light is achieved. This allows the detection of weak ac red light signals.

Notice that the gain only exceeds unity if the ac light can penetrate through the photodiode into the photoconductor (i.e., red ac light), so the device functions as a switch for the blue light response.

According to the material parameters that were measured for this device, the RC time constant of this device is on the order of 1 μs.

What is claimed is:

1. A semiconductor device comprising:
   (a) a photodiode (a region having a photovoltaic junction) region wherein first light of constant magnitude is absorbed;
   (b) a photoconductive region electrically connected in series to said junction region, said photoconductive region having a conductivity modulated by absorbed second light having a magnitude which changes with time, and both of said regions having electron affinities so as to not form a barrier to the passage of charge when they are illuminated by said light such that the electrical output from said semiconductor device has a magnitude determined by said constant magnitude and is in phase with said change in magnitude of said second light; and
   (c) electrical contacts connected to said photodiode region and said photoconductive region.

2. The semiconductor device of claim 1 wherein said photodiode and said photoconductive region are formed sequentially in tandem so as to be adjacent to each other.

3. The semiconductor device of claim 1 wherein said photodiode and said photoconductive region are connected by an electrically conductive medium.

4. The semiconductor device of claim 2 wherein said photodiode and said photoconductive region include a common semiconductor material.

5. The semiconductor device of claim 4 wherein said photodiode and said photoconductive region include an amorphous semiconductor material.

6. The semiconductor device of claim 5 wherein said amorphous material is selected from the group consisting of silicon, germanium, silicon carbide, silicon nitride and alloys thereof.

7. The semiconductor device of claim 4 wherein said photodiode includes $Cu_2S$ and $CdS$ and said photoconductive region includes $CdS$.

8. The semiconductor device of claim 4 wherein said photodiode is a Schottky barrier.

9. The semiconductor device of claim 4 wherein said photodiode is a p-n junction.

10. The semiconductor device of claim 1 wherein said photodiode includes a crystalline silicon p-n junction photodiode and said photoconductive region includes a material selected from the group consisting of cadmium-chalcogenides and lead-chalcogenides.

11. The semiconductor device of claim 1 wherein said photodiode includes a material selected from the group consisting of the pnictides of aluminum, gallium and indium in single crystalline form, or alloys thereof.

* * * * *